United States Patent [19]

Percival et al.

[11] Patent Number: 4,689,657
[45] Date of Patent: Aug. 25, 1987

[54] IC INTERCONNECT SYSTEM USING METAL AS A MASK

[75] Inventors: Richard Percival, Burghfield, United Kingdom; Ernst Uhlmann, Stettfurt, Switzerland

[73] Assignee: Lasarray Holding AG, Thundorf, Switzerland

[21] Appl. No.: 754,007

[22] Filed: Jul. 11, 1985

Related U.S. Application Data

[62] Division of Ser. No. 463,817, Feb. 4, 1983.

[30] Foreign Application Priority Data

Feb. 19, 1982 [CH] Switzerland .................... 1036/82

[51] Int. Cl.[4] .................... H01L 23/48; H01L 29/44; H01L 29/52; H01L 29/60
[52] U.S. Cl. .................... 357/68; 357/40; 357/41; 357/65
[58] Field of Search .................... 357/68, 24, 92, 45, 357/42, 41, 40, 65

[56] References Cited

U.S. PATENT DOCUMENTS

| | | | |
|---|---|---|---|
| 3,304,594 | 2/1967 | Madland | 357/40 X |
| 4,000,502 | 12/1976 | Butler et al. | 357/68 X |
| 4,161,662 | 7/1979 | Malcolm et al. | 357/42 X |
| 4,500,906 | 2/1985 | Ohno et al. | 357/68 X |
| 4,644,382 | 2/1987 | Charransol et al. | 357/40 X |
| 4,649,413 | 3/1987 | Kelly | 357/40 X |

FOREIGN PATENT DOCUMENTS

0088045 10/1986 European Pat. Off. .......... 357/68 X

OTHER PUBLICATIONS

"Lasarray Direct—Write—Laser DWL", Lasarray Corporation, 191 Lunar Drive, Scotts Valley, Calif. 95066, Jun. 1, 1987, pp. 1–6.

"SPIE's 1987 Santa Clara Symposium on Microlithography, Advance Program", Mar. 1–6, 1987, The Int'l Soc. For Optical Engineering, pp. 1–15.

Fitzgibbons et al., "A Direct Write Laser Pattern Generator for Rapid Semiconductor Device Customization", SPIE's Santa Clara Symposium on Microlithography, Mar. 1–6, 1987.

*Primary Examiner*—Andrew J. James
*Assistant Examiner*—William A. Mintel
*Attorney, Agent, or Firm*—Werner W. Kleeman

[57] ABSTRACT

During the manufacture of semi-custom monolithic integrated circuits or semiconductor devices silicon wafers with P-type or N-type impurity regions are used and interconnections must be produced for specific applications. Unlike currently known technologies, an electrically conductive film containing standardized openings in a pre-arranged raster is deposited on the silicon wafer. Subsequently, the conductive film is removed between preselected openings directly or indirectly by means of electromagnetic radiation in order to produce the required circuit configuration. A laser beam is particularly appropriate therefor because such beam can be positioned and controlled and can be used directly for the exposure of a photosensitive film. The production of isolated conductive areas in the conductive film is then accomplished by photo-etching. The use of an expensive customer specific photomask can thus be avoided. In the thus obtained semiconductor device the conductive film contains a regular arrangement of openings which form the ends, sides or corners of isolated conductive areas.

3 Claims, 6 Drawing Figures

IC INTERCONNECT SYSTEM USING METAL AS A MASK

CROSS-REFERENCE TO RELATION APPLICATION:

This application is a divisional application of our commonly assigned, copending U.S. application Ser. No. 06/463,817, filed Feb. 4, 1983.

BACKGROUND OF THE INVENTION

The present invention relates to a new and improved structure of a monolithic integrated semiconductor device. The present invention also relates to a new and improved method of manufacturing such monolithic integrated semiconductor devices.

During the manufacture of customer specified integrated circuits, particularly in small and medium quantities, a pre-fabricated silicon wafer is used, distinguished by a multiplicity of P and N (or N and P) structures, i.e. a structure formed by a multiplicity of impurity-doped regions each of which constitutes, for example, a P-type impurity region present in an N-type impurity region or vice versa and which impurity-doped regions are connected with contact surfaces through a silicon dioxide layer and an electrically conductive aluminium film which is placed on top of the silicon dioxide layer and forms electrical connections between preselected ones of the said P and N structures or impurity-doped regions. The connection between the contact surfaces and the aluminium film occurs through so-called contact windows in the silicon dioxide layer which are arranged more or less regularly, and are visible in the aluminium film, and whose area forms a complete or partial conductive link (a so-called ohmic contact) with the contact surface.

It is well-known that the specialist, making use of electrical connections between the individual contact surfaces (in the XY plane), can create logical or linear circuits.

The required electrical connections are produced by applying well-known photo-etching techniques, which require the use of a relatively expensive photomask.

This situation is further aggravated by the fact that such expensive photomask must be specially and separately manufactured for each specific application or photo-etching operation.

SUMMARY OF THE INVENTION

It is an important object of the invention to realize an inexpensive and quick technique for the manufacturing monolithic integrated semiconductor devices.

A further important object is directed to a new and improved method of manufacturing monolithic integrated semiconductor devices without the use of special and expensive photomasks.

Now, in order to implement these and still further objects of the invention which will become more readily apparent as the description proceeds, the method of the present development is manifested by the features that, during a preliminary process step a series of regularly spaced openings is formed in the electrically conductive film. The spacing of the openings is selected to be similar or equal to the minimum width of a conductor. During a second process step the conductive film is removed along linear removal paths between preselected numbers of the openings such that there are formed insular or isolated conductive areas.

As alluded to above, the invention is not only concerned with the aforementioned method aspects, but also relates to a new and improved structure of a monolithic integrated semiconductor device. In its more particular aspects, such a monolithic integrated semiconductor device comprises an electrically conductive film or layer containing a prearranged raster or grid or substantially regular pattern of openings. Preselected numbers of these openings are interconnected by related substantially linear openings or straight lines and are thus arranged at the sides, the ends or the corners of insular or isolated conductive areas connected with respective underlying semiconductor devices.

BRIEF DESCRIPTION OF THE DRAWINGS

The invention will be better understood and objects other than those set forth above, will become apparent when consideration is given to the following detailed description thereof. Such description makes reference to the annexed drawings wherein throughout the various figures of the drawings there have been generally used the same reference characters to denote the same or analogous components and wherein.

DETAILED DESCRIPTION OF THE PREFERRED EMBODIMENTS

Figure 1:
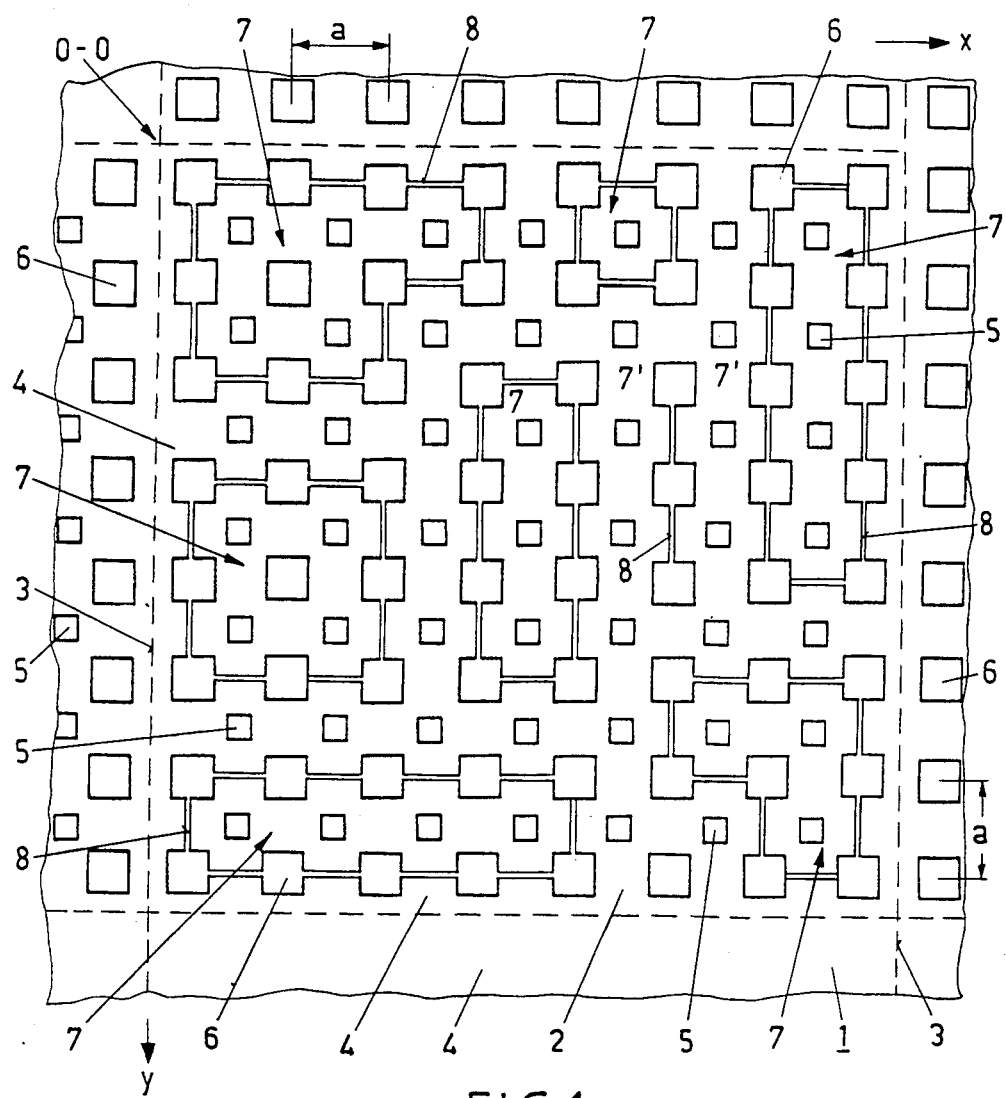
FIG. 1 is a simplified top plan view of a silicon wafer comprising dies bordered by dotted lines from which the bonding pads have been omitted and which dies constitute a first embodiment of the inventive monolithic integrated semiconductor device.

Describing now the drawings, it is to be understood that only enough of the structure of the monolithic integrated semiconductor device has been shown as needed for those skilled in the art to readily understand the underlying principles and concepts of the present development, while simplifying the showing of the drawings. Turning attention now specifically to FIG. 1 of the drawings, there is shown therein a top plan view of the first embodiment of the inventive monolithic integrated semiconductor device containing a prefabricated silicon wafer generally designated by reference character 1. This prefabricated silicon wafer 1 contains P and N or N and P structures, i.e. a structure formed by a multiplicity of conventional impurity-doped regions like, for example, P-type impurity regions within a larger N-type impurity-doped region or vice versa, see also FIG. 2 and containing a predetermined number of at least in part regularly recurring contact surfaces 5. A single die (chip) 2 of the prefabricated silicon wafer 1 and its separation points are schematically indicated by dotted lines 3.

On the silicon wafer 1, a conductive film or layer 4 of aluminium has been evaporated in conventional manner on top of an insulating layer which is not visible in FIG. 1 and which may constitute a silicon dioxide layer.

The conductive film or layer 4 is connected to the contact surfaces 5 of the aforementioned structures or impurity-doped regions.

The conductive film or layer 4 contains at least in part a substantially regular pattern of openings 6 or regularly spaced openings 6. The openings 6 are created by conventional photo etching techniques using a standard photomask and have a raster pitch a.

By removing the conductive film or layer 4 along straight lines there are produced substantially straight-lined or linear openings 8 and isolated conductive areas 7, 7' which are connected as appropriate to remote contact points.

A laser trimmer machine (e.g. Model 40 or 80 from ESI Inc., Portland/Ore., USA) is suitable for the purpose of removing the conductive film or layer 4 along straight lines in order to thereby produce the substantially linear openings 8. Starting from a reference point designated 0,0, the laser beam scans the surface of the silicon wafer 1. The laser beam scans the horizontal plane or surface of the prefabricated silicon wafer 1 or chip, i.e. the conductive film or layer 4 first in the x-direction, then in the y-direction in accordance with a predetermined control program. The scan lines are separated by the pitch a. During such scanning operation the laser beam is intermittently switched on and off, causing a removal, marking, or exposure of the chip surface as required by, and according to, the control program.

Depending on the selected technique, the laser trimmer machine utilizes a continuous-wave laser of greater or lesser power. When a high powered laser is used to actually melt or evaporate the conductive film or layer 4 such a high-powered laser must be precisely calibrated for a particular conductive film or layer 4. A low powered laser (for instance Scientific Air-Cooled Argon Ion Laser model 162 A, from Spectra Physics, Santa Clara, Calif., USA) may be used compatibly with the standard photo-etching technique used for the making of the openings 6, either during the same or a separate operation.

The technique described hereinbefore has the advantage that in practice the applied laser beam can be guided with the aid of the openings 6 allowing the conductive areas 7, 7' to be made simply and without the appearance of errors. Positioning and angular errors are tolerable within wide limits, without putting product quality at risk.

The isolated electrically conductive areas 7, 7' may be obtained by either one of the following methods which are briefly described hereinafter in a number of illustrative Examples.

EXAMPLE 1

The prefabricated silicon wafer to be processed is coated with positive or negative photoresist and then exposed through a standard photomask possessing windows (for positive reproduction) or features (for negative reproduction) which correspond to the size of the required openings. After development and etching, the conductive metal film or layer is removed to form the openings in the conductive film. After stripping the wafer may be stored.

In order to produce the desired specific monolithic integrated circuit or semiconductor device the wafer is coated with a positive photo resist (for instance microposit 23 by Shipley Company Inc., Massachussets, USA) and the photoresist is exposed using the aforementioned laser trimmer machine as required by the control program to remove the photoresist along straight lines. The conductive film can then be etched away and thereafter the remaining photoresist is stripped.

EXAMPLE 2

The prefabricated silicon wafer is coated with positive photoresist, exposed through the standard window photomask, developed, etched and stored in a light-proof container.

At the appropriate time the thus pretreated silicon wafer is removed from the container and the photoresist is exposed using the program-controlled laser beam and thereafter developed again. In the region of the straight-line cuts the conductive film is etched away and the remaining photoresist is stripped.

EXAMPLE 3

The prefabricated silicon wafer is coated with positive photoresist, exposed through the standard window photomask, and stored in a light-proof container. After further exposure to the program-controlled laser beam, the photoresist is developed; the exposed conducting film at the surface of the wafer is then etched away and the remaining photoresist is stripped.

EXAMPLE 4

The prefabricated silicon wafer is coated with positive photoresist and the photoresist is exposed through the standard window photomask. The photoresist is developed, and the wafer is stored in a light-proof container.

After further exposure using the program-controlled laser beam, the photoresist is again developed.

Then the exposed conductive film at the surface of the silicon wafer is etched away and the remaining photoresist is stripped.

The selection of the most appropriate method is dictated by the type of laser machine and its control, and by the planned storage-time of the silicon wafers.

During the manufacture of the openings 6 and of the straight-lines or substantially linear openings 8, however, other known additive or subtractive processes can be used, for example, laser-assisted chemical vapor deposition using photo-excitation, photo-dissociation or local heating as the laser-assisted processes, and laser-assisted etching like, for example, activation of a gaseous chlorine etchant by laser light.

In a practically realized equipment, the coordinate table from a wafer and substrate cutting machine (Model 8002 by ESEC, Hünenberg, Switzerland) is used to produce the movements of the prefabricated silicon wafer 1 in the x and y direction and the light intensity of the cw laser beam is modulated by an electro-optical shutter (Coherent Associates, Danbury, Connecticut, USA), all of which operations are carried out under the control of a special computer program.

Electron beams and electromagnetic radiation of other wavelengths can be used instead of the aforementioned laser beam.

The monolithic integrated semiconductor devices produced by means of the techniques described hereinbefore, are primarily suitable for logic circuits (logic arrays) which are used as control systems, but are also suitable for circuits producing and distributing clock signals, scratch-pad memories, interfaces for keyboards and switches, bus controllers, circuits for signal distribution, handshaking, and output stages for LED and LCD displays.

The afore-described technology is best exploited by implementing a library of standard logic functions based upon a primitive element (one P and one N channel transistor) known as a stage. By use of a suitable computer program, construction of logic circuits can be made directly and economically from a truth-table or behavioral description. Data from the computer serves directly or indirectly to control the coordinate table and the laser beam.

As shown by the second embodiment of the inventive monolithic integrated semiconductor device described hereinbelow with reference to FIGS. 2 to 6, analog charge coupled devices can also be realized by utilizing the inventive technique. A monolithic integrated semiconductor device is shown in schematic cross section in FIG. 2 which demonstrates the layered structure of such device. The illustrated device constitutes a so-called bucket-brigade-device constructed of transistors, whose sources are marked S, whose gates are marked G and whose drains are marked D. The isolated conductive areas 7, 7' have the function of clock-lines. The structrual elements marked D and S are associated with two transistors.

In an n-doped prefabricated silicon wafer 9 there are present a predetermined number of p+ diffusions or p+-type impurity-doped regions 10 which are covered with the exception of contact surfaces or areas by a silicon dioxide insulating layer 11 and a conductive aluminium film or layer 12 deposited thereupon. For simplicity the isolated conductive areas 7, 7' which are important for the definition of the function of the device are shown by lines.

Figure 2:
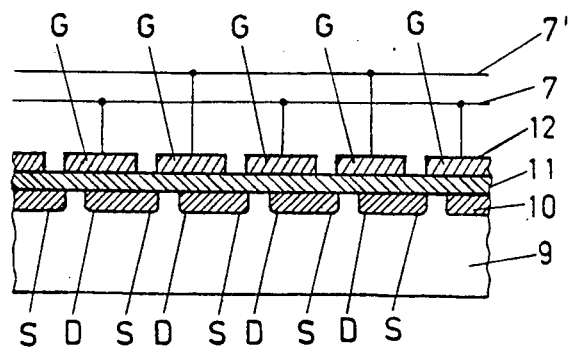
FIG. 2 is a fragmentary sectional view through a charge-transfer device constituting a second embodiment of the inventive monolithic integrated semiconductor device.
Figure 3:
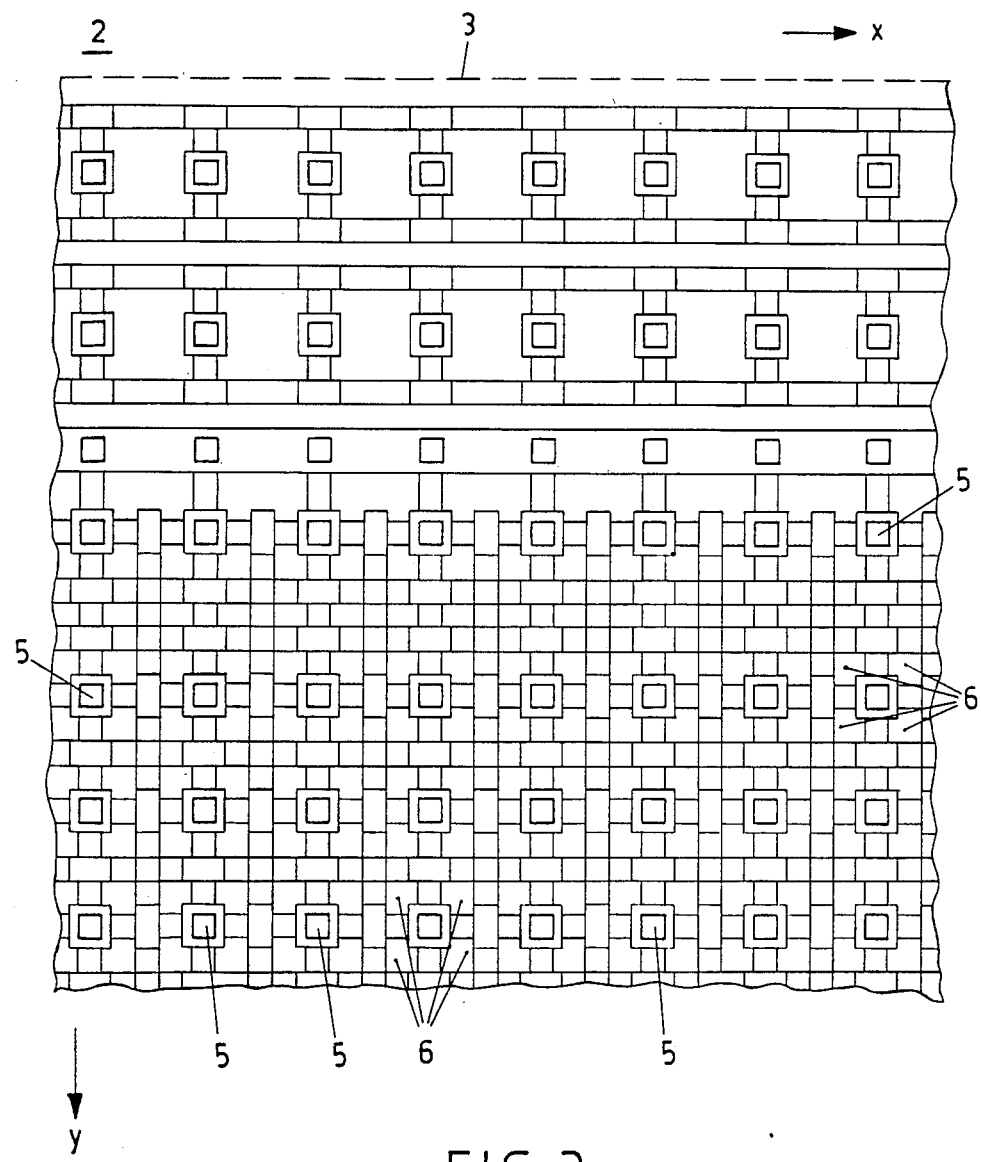
FIG. 3 is a top plan view of a conductive film on part of a prefabricated silicon wafer containing transistors organized as shown in FIG. 2.

For manufacturing the monolithic integrated semiconductor device of FIG. 2, there is used the prefabricated silicon wafer with a standard raster as shown in FIG. 3. The edges of a single die 2 are shown by the dotted line 3 which indicates the separating points. The squares represent a predetermined number of at least in part regularly recurring contact surfaces or areas 5 which are present in the conductive aluminium film or layer 12 shown in FIG. 2 and which provide electrical contact with the underlying impurity-doped regions or structures 9, 10. Openings 6, for instance, of six-sided shape surround or are associated with the contact surfaces or areas 5 and are arranged in an appropriate, substantially regular raster or pattern.

This prefabricated silicon wafer contains an underlying multiplicity of impurity-doped regions constituting semiconductor layers (see FIG. 6) which can be utilized for producing bucket-brigade-devices of any desired length by means of straight line cuts or linear openings 13 in the conductive aluminium film or layer 12 in the x and y directions.

Figure 4:
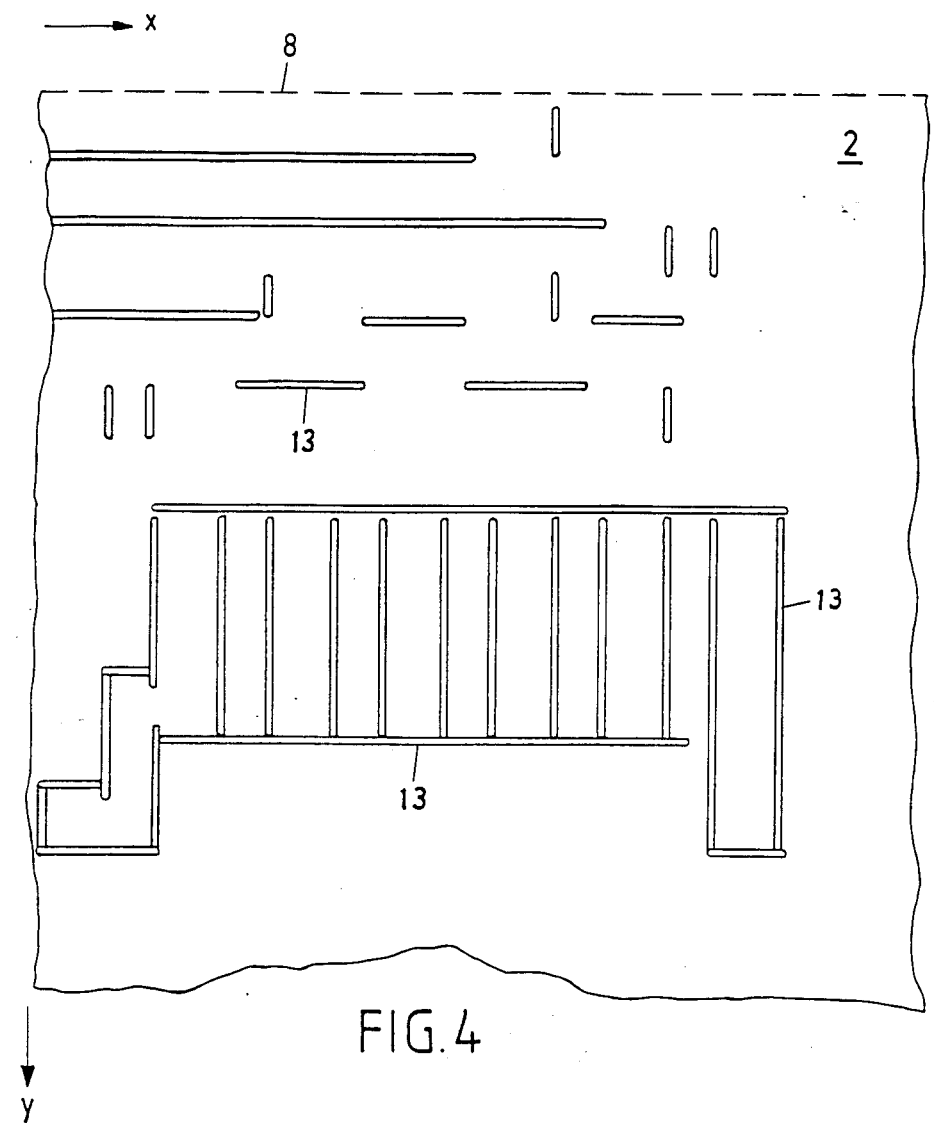
FIG. 4 is a schematic representation demonstrating the removal of the conductive film along straight lines and the creation of the circuit shown in FIG. 2 on part of the silicon wafer.

FIG. 4 shows the required cutting pattern for producing isolated conductive areas 7, 7' by interconnecting a preselected number of the openings 6 through substantially straight line cuts or linear openings 13. In a practical example a positive photoresist (Microposit 23) is deposited on the wafer surface and exposed to the 458 nm wavelength argon ion laser beam from a CW-laser operating at an output power of 0.2 mW and a scanning speed of 25 cm/sec.

The argon ion laser beam is aimed at the center of the openings or windows 6 and switched on or off according to the position of the silicon wafer on the aforementioned coordinate table which is displaced according to the related control program.

It is obvious that the roles of the laser beam and the coordinate table can be exchanged so that an identical cutting pattern is obtained when the coordinate table containing the silicon wafer is held in a fixed position and the displacement of the laser beam is controlled by a related control program.

Figure 5:
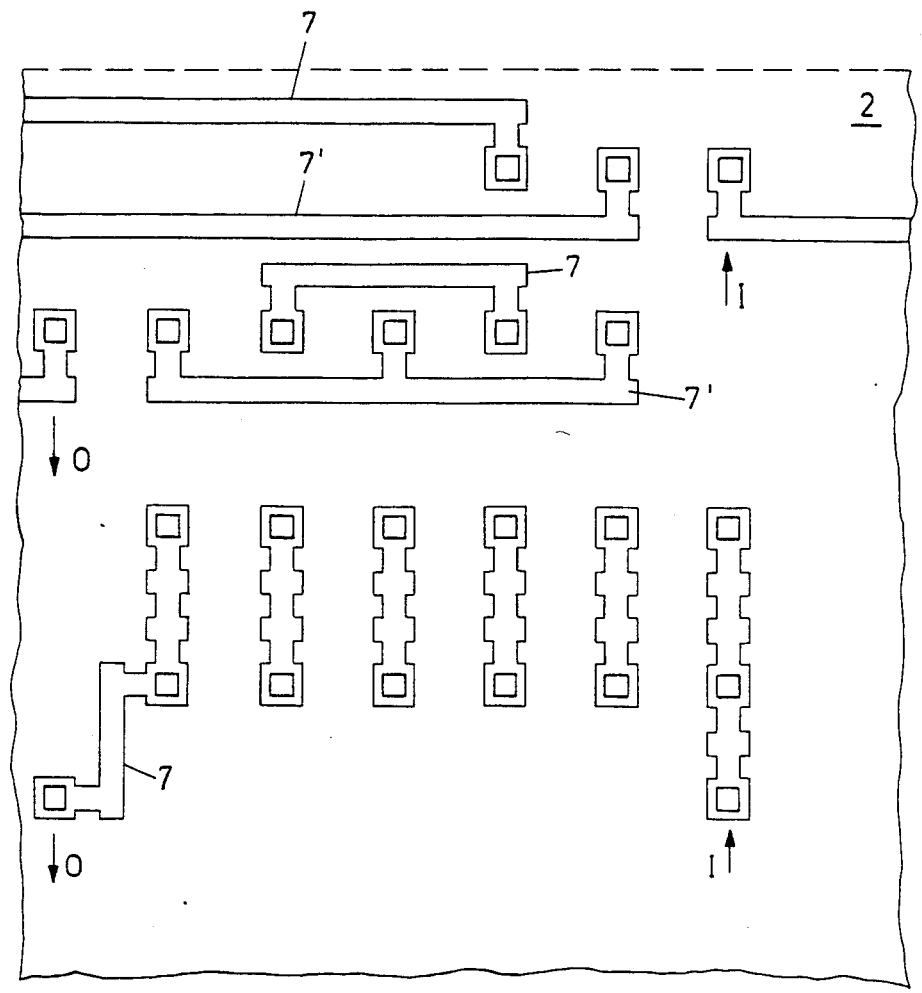
FIG. 5 is a top plan view of the part of the prefabricated silicon wafer shown in FIGS. 2 to 4 after removal of the conductive film along straight lines.

The finished circuit or monolithic integrated semiconductor device illustrated in FIG. 2 is shown in FIG. 5. The isolated conductive areas are also designated by the reference characters 7, 7'. The inputs are designated by the reference character I and the outputs by the reference character 0.

Figure 6:
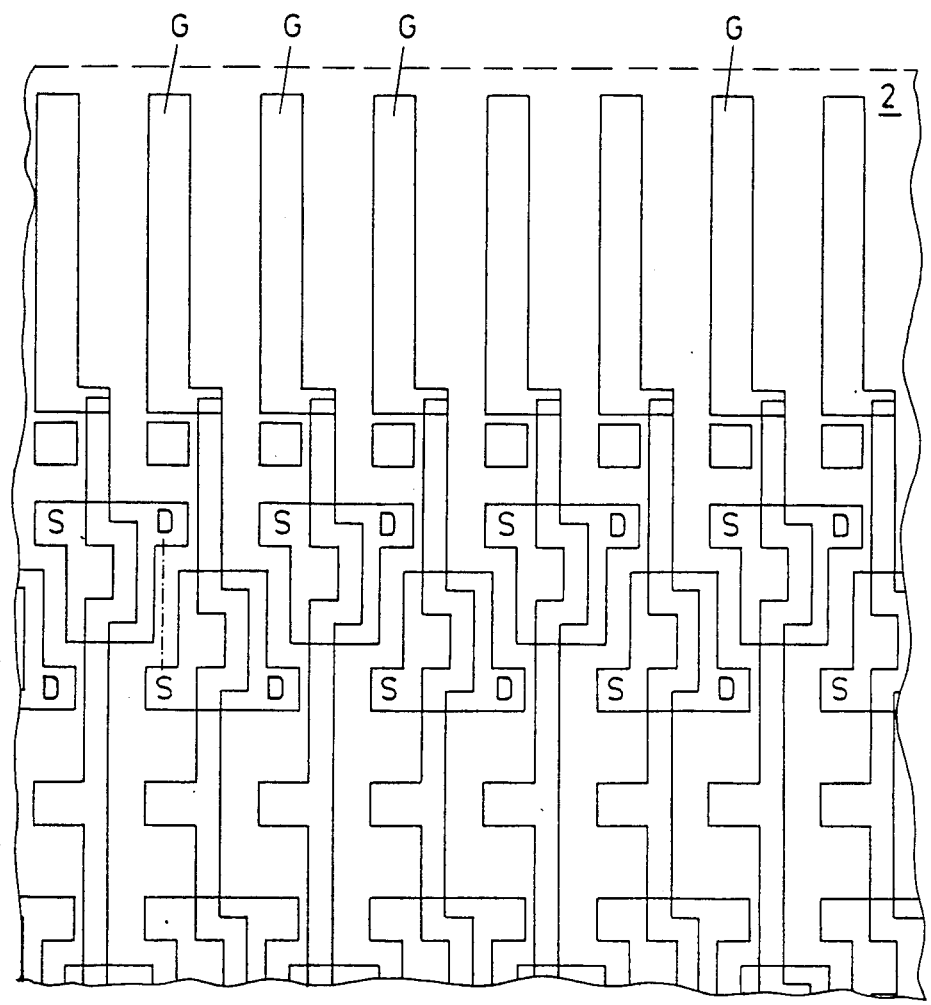
FIG. 6 illustrates the underlying transistors which form the circuit shown in FIG. 2 and which underlie the part of the prefabricated silicon wafer shown in FIGS. 3 to 5.

For completeness, the transistors are shown in simplified form as diffusion layers in FIG. 6. In conformity with FIG. 2, the sources are designated by the reference character S, the gates by the reference character G, and the drains by the reference character D. The necessary metallic connection between two neighboring transistors is symbolically indicated by a dotted line.

The entire structure and function of the integrated circuit or monolithic integrated semiconductor device described hereinbefore with reference to FIGS. 2 to 6 can be produced in a simple manner from standard chips possessing a standard pattern of openings 6 in the conductive film or layer 12. The techniques described hereinbefore can also be employed for processing structures requiring several levels of electrically conductive film.

While there are shown and described present preferred embodiments of the invention, it is to be distinctly understood that the invention is not limited thereto, but may be otherwise variously embodied and practiced within the scope of the following claims.

Accordingly, What we claim is:

1. A monolithic integrated semiconductor device comprising:
   a silicon wafer;
   said silicon wafer comprising a substrate possessing a multiplicity of impurity-doped regions;
   an insulating layer covering said substrate of said silicon wafer;
   a conductive film covering said insulating layer;
   a predetermined number of at least in part regularly recurring contact surfaces associated with related ones of said impurity-doped regions;
   said insulating layer containing a prdetermined number of at least in part regularly recurring openings which are associated with said predetermined number of at least in part regularly recurring contact surfaces;
   a preselected number of said at least in part regularly recurring contact surfaces being connected with said conductive film;
   said conductive film containing at least in part a substantially regular pattern of openings;
   a predetermined number of isolated conductive areas formed in said conductive film and separated from each other;

each one of said isolated conductive areas being defined by a preselected number of said openings of said substantially regular pattern of openings of said conductive film and by a preselected number of substantially linear openings defining substantially straight lines formed in said conductive film and interconnecting said preselected number of openings of said substantially regular pattern of openings of said conductive film; and;

each said predetermined number of isolated conductive areas containing at least one of said regularly recurring openings associated with one of said regularly recurring contact surfaces.

2. The seminconductor device as defined in claim 1, wherein:
said conductive film containing at least in part said substantially regular pattern of openings, contains a predeterminate pattern of openings.

3. The semiconductior device as defined in claim 1, wherein:
said preselected number of openings associated with each one of said isolated conductive areas are selectively arranged at ends, corners or sides of said isolated conductive areas.

* * * * *